United States Patent [19]

Tobita et al.

[11] Patent Number: 5,079,744
[45] Date of Patent: Jan. 7, 1992

[54] TEST APPARATUS FOR STATIC-TYPE SEMICONDUCTOR MEMORY DEVICES

[75] Inventors: Youichi Tobita; Yuji Kihara, both of Hyogo, Japan

[73] Assignee: Mitsubishi Denki Kabushiki Kaisha, Tokyo, Japan

[21] Appl. No.: 547,251

[22] Filed: Jul. 3, 1990

[30] Foreign Application Priority Data

Jul. 13, 1989 [JP] Japan ................... 1-180969

[51] Int. Cl.$^5$ .................................... G11C 29/00
[52] U.S. Cl. ............................... 365/201; 371/21.1; 365/190
[58] Field of Search ........... 365/201, 154, 190, 189.09, 365/189.07, 226; 371/21.1

[56] References Cited

U.S. PATENT DOCUMENTS

| | | | |
|---|---|---|---|
| 4,267,583 | 5/1981 | Suzuki | 365/201 |
| 4,553,225 | 7/1985 | Ohe | 365/201 |

FOREIGN PATENT DOCUMENTS

| | | |
|---|---|---|
| 0192121 | 8/1986 | European Pat. Off. |
| 2947764 | 6/1980 | Fed. Rep. of Germany |
| 61-280095 | 12/1986 | Japan |

OTHER PUBLICATIONS

1977 Mitsubishi Integrated Circuit Databook (LSI), vol. 5, pp. 3-6.

Primary Examiner—Joseph A. Popek
Attorney, Agent, or Firm—Lowe, Price, LeBlanc & Becker

[57] ABSTRACT

A static type semiconductor memory device is provided with a power circuit for a disturb test, in which MOS transistors constituting a memory cell are examined for an abnormal threshold voltage. A P-channel MOS transistor is provided between a power supply, and the memory cells. The P-channel MOS transistor is rendered conductive in the normal mode, allowing the voltage to the memory cells as under normal circumstances. In addition, between the power supply and the memory cells, there is provided a series-connection of a diode-connected N-channel MOS transistor and a P-channel MOS transistor. In the disturb test, this P-channel MOS transistor is rendered conductive. As a result, the supply voltage reduced by the N-channel MOS transistor, or a voltage lower than the supply voltage by the threshold voltage of this N-channel MOS transistor is supplied to the memory cells. By configuring the static type semiconductor memory device in this manner, the time required for the potential difference between the two storage nodes in a memory cell to become small enough, due to a defective transistor in the memory cell, to cause malfunction of the device is reduced. Thus, the time required for the disturb test is shortened.

10 Claims, 9 Drawing Sheets

FIG.4
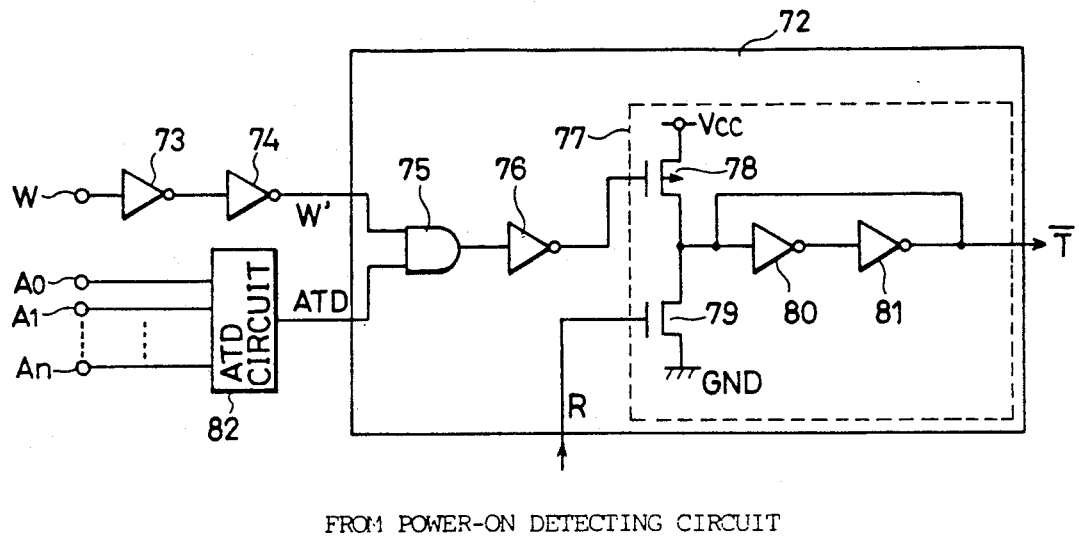
FROM POWER-ON DETECTING CIRCUIT
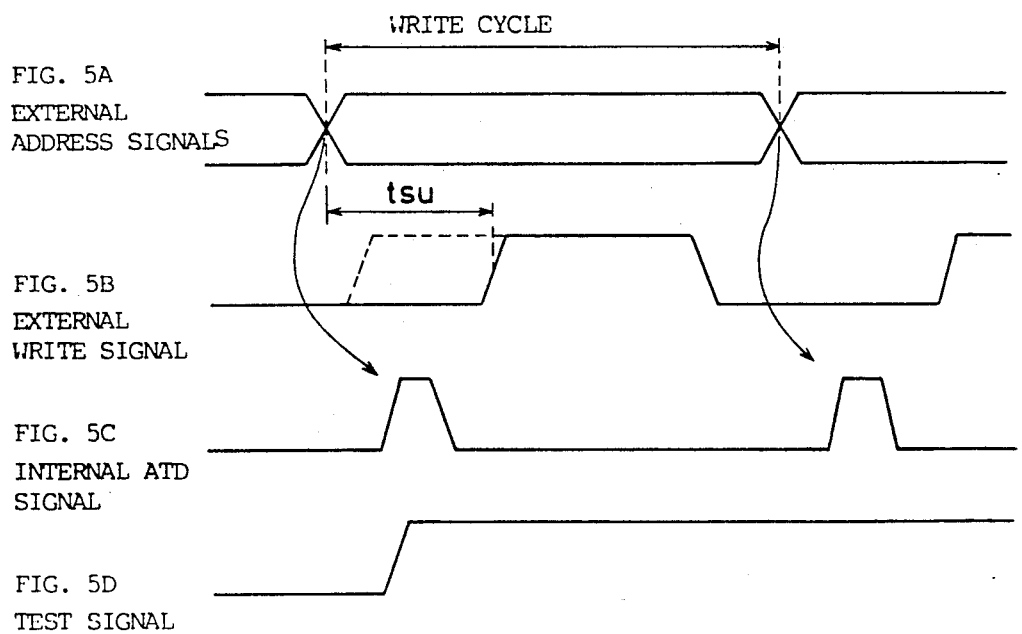
FIG. 5A
EXTERNAL
ADDRESS SIGNALS
FIG. 5B
EXTERNAL
WRITE SIGNAL
FIG. 5C
INTERNAL ATD
SIGNAL
FIG. 5D
TEST SIGNAL

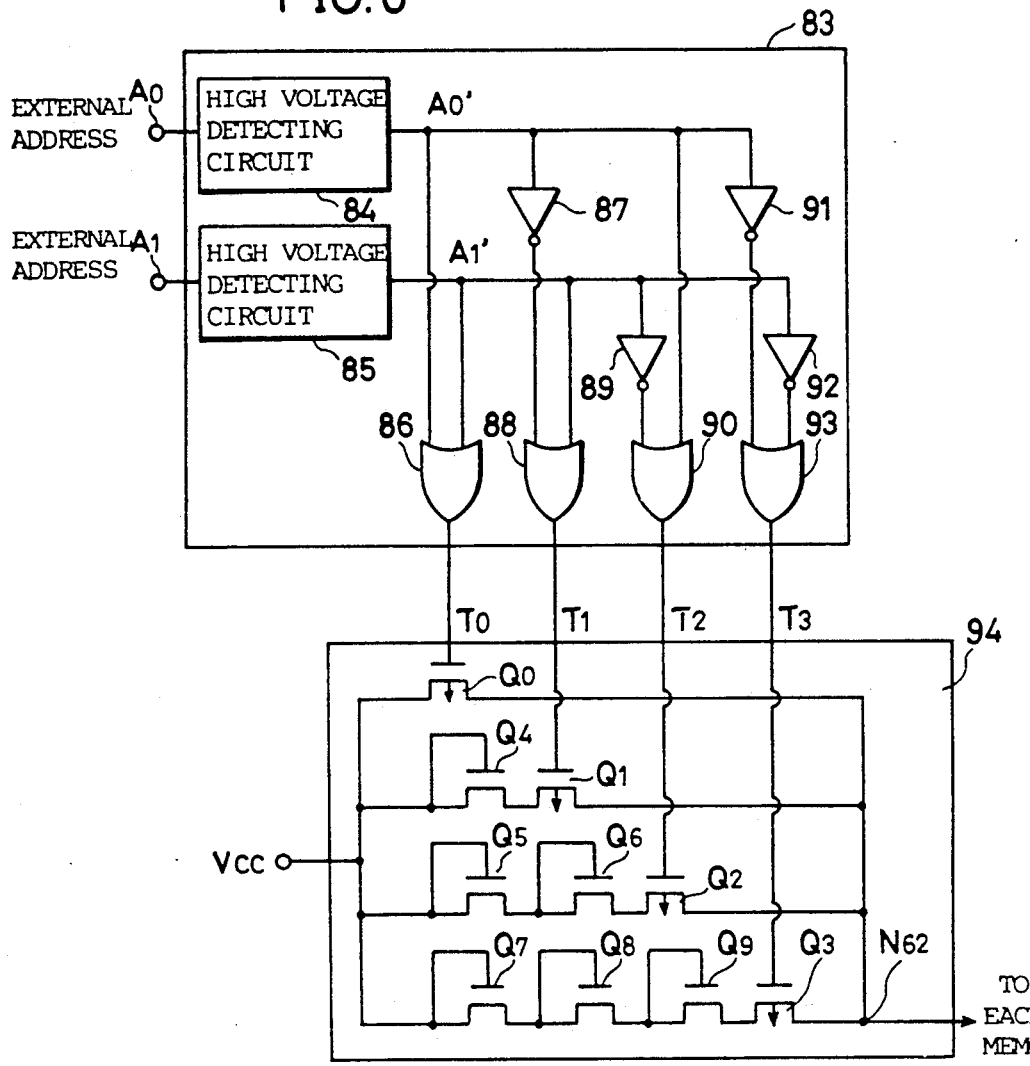

FIG.8
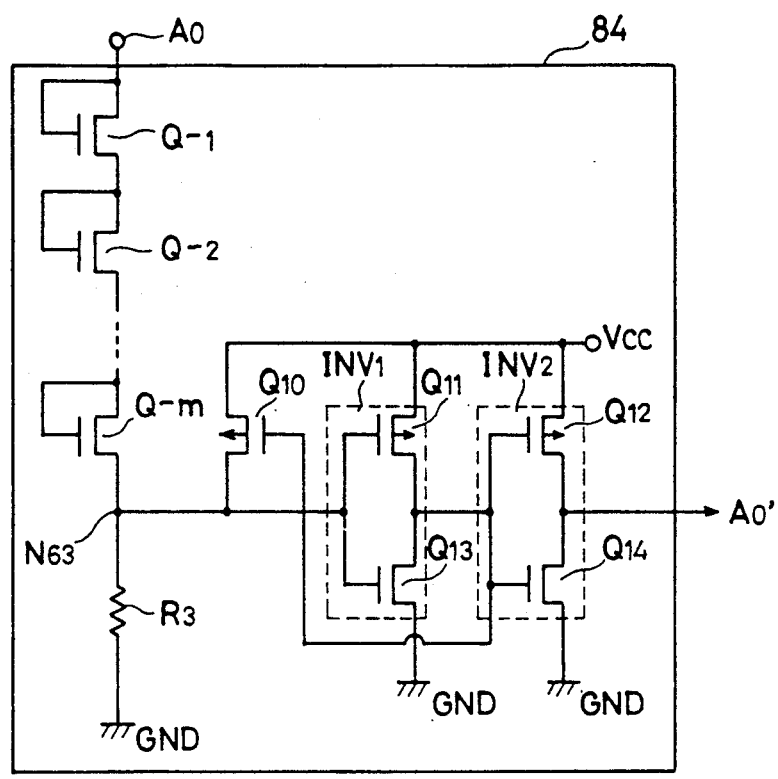
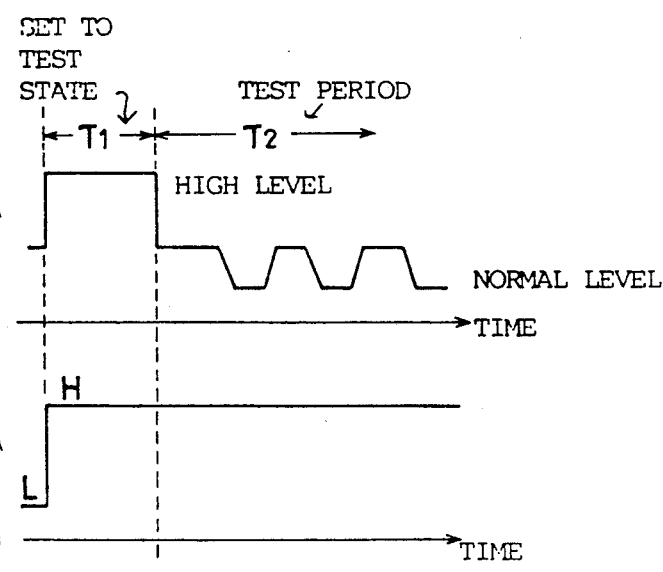
FIG.9A
POTENTIAL OF EXTERNAL TERMINAL Ao
FIG.9B
SIGNAL Ao'

TEST APPARATUS FOR STATIC-TYPE SEMICONDUCTOR MEMORY DEVICES

BACKGROUND OF THE INVENTION

1. Field of the Invention

The present invention generally relates to static type semiconductor memory devices, and more particularly, to a static type semiconductor memory device having a power circuit for test mode, and an operating method thereof.

2. Description of the Background Art

SRAM's (Static Random Access Memories) are one type of semiconductor memory devices. Since a memory cell of a SRAM is comprised of MOSFET's (insulated gate field effect transistors) only or of a flip-flop of MOSFET's and resistance elements, storage information in the SRAM will not disappear with the lapse of time while power supply is on. In the SRAM's, therefore, there is no need for rewriting, or refreshing storage information, as is required in DRAM's (Dynamic Random Access Memories). Also with the SRAM's, generally, a lower consumption power for operation and data holding, and a higher-speed operation can be achieved. Due to these advantages, the SRAM's are used in a variety of fields.

FIG. 10 is a schematic block diagram showing a typical structure of an SRAM. Referring to the diagram, the SRAM comprises a memory cell array 101 having a plurality of memory cells arranged in a matrix, word lines provided each corresponding to one row, and bit line pairs provided each corresponding to one column, and an X address buffer decoder 102 and a Y address buffer decoder 103 which put only a memory cell to be selected in a data writable or readable state by amplifying and decoding a row address signal and a column address signal, respectively, for selecting the memory cell located in the memory cell array 101 to and from which data is written in and read out. The SRAM further comprises an R/W control circuit 104 responsive to a read and write signal R/W which designates either data writing or reading mode for the selected memory cell, for setting a read and write amplifier 105 and a data output buffer 106 which will be described later in the mode designated by the read and write signal R/W, and in data writing, applying input data Din to be written in to the read and write amplifier 105, the read and write amplifier 105 for, in data reading, amplifying the data read out from the selected memory cell and applying the amplified data to the data output buffer 106, and in data writing, amplifying the input data Din applied through the R/W control circuit 104 and outputting the amplified data to the memory cell array 101, and the data output buffer 106 for further amplifying the read-out data received from the read and write amplifier 105 in data reading and outputting the thus amplified data to the outside as output data Dout.

In data writing, the input data outputted from the read and write amplifier 105 is applied to the bit line pair corresponding to the selected memory cell in the memory cell array 101. In data reading, the storage data of the selected memory cell in the memory cell array 101 appear on the corresponding bit line pair to be applied to the read and write amplifier 105 as read-out data.

FIG. 11 is a circuit diagram showing structure of one-column memory cells in the memory cell array 101 of FIG. 10. Referring to the diagram, the structure will be described below.

In the diagram, between two bit lines 23 and 24 constituting one bit line pair, there are provided a plurality of memory cells 21a to 21n. The memory cells 21a to 21n are configured in the same manner. Taking now the memory cell 21a as an example, it is comprised of two N-channel MOSFET's as an inverter (referred to as inverter transistors hereinafter) 38a and 39a, two high load resistances 40a and 41a, and two N-channel MOSFET's for access (referred to as access transistors hereinafter) 36a and 37a. The drains of the inverter transistors 38a and 39a are connected at storage nodes N10a and N11a, respectively, to one-side ends of the load resistances 40a and 41a which are formed of polysilicon or the like to have high resistance values, while the other ends of the resistances 40a and 41a are connected to supply potential Vcc for driving the memory cell. The sources of these inverter transistors 38a and 39a are connected to ground potential GND through a ground potential line ls. The inverter transistor 38a has its gate connected to the storage node N11a and the inverter transistor 39a has its gate connected to the storage node N10a. The storage data are stored as potential at parasitic capacitances existing between the ground potential GND and the storage nodes N10a and N11a, respectively. The storage node N10a is connected to the bit line 23 through the access transistor 36a, which has its gate connected to the corresponding word line 25a among other word lines 25b to 25n. The storage node N11a is connected to the bit line 24 through the access transistor 37a, which has its gate connected to the corresponding word line 25a.

The bit lines 23 and 24 are connected to input/output lines 32 and 33, respectively, through MOSFET's 30 and 31, the gates of which receive a column select signal $Y_0$ from the Y address buffer decoder 103 (FIG. 10). The word lines 25a to 25n receive row select signals $X_0$ to $X_n$, respectively, from the X address buffer decoder 102 (FIG. 10). Further, the bit lines 23 and 24 are connected through diode-connected bit line loading MOSFET's 28 and 29 to a connection line 22 to which supply potential Vcc is applied. These MOSFET's 28 and 29 are provided for precharging the bit lines 23 and 24. That is, the bit lines 23 and 2 are raised to Vcc-Vth, a potential lower than the supply potential Vcc by the threshold voltage Vth of the MOSFET's 28 and 29.

Subsequently, operation of such a memory cell will be described. Assume now that data stored in the memory cell 21a is to be read out with the node N10a at the low level and the node N11a at the high level. In this case, potential of the row select signal $X_0$ applied to the word line 25a rises from the unselected level of about 0V to substantially Vcc. As a result, current flows through the connection line 22, the bit line loading MOSFET 28, the access transistor 36a and the inverter transistor 38a, to the ground potential GND. Since the inverter transistor 39a is non-conductive, however, current flow does not occur through a path linking the connection line 22, the bit line loading MOSFET 29, the access transistor 37a and the inverter transistor 39a, to the ground potential GND. Accordingly, the bit line 23 is set to a potential depending on the on-resistance ratio between the MOSFET's 28, 36a and 38a, while the bit line 24 remains set at the potential lower than the supply potential Vcc by the threshold voltage of the bit line loading MOSFET 29. The data is read out based on the detection of the potential difference which appears between the two bit lines of this bit line pair.

In such SRAM's also, a larger storage capacity, or a larger number of memory cells on one chip has been pursued. Therefore, it has been required to arrange memory cells on a semiconductor substrate with a highest possible density. In forming memory cells on a semiconductor substrate under such conditions, the layout is made such that the area occupied by an interconnection layer is as small as possible on the substrate.

FIG. 12 is a circuit diagram showing structure of the memory cell of FIG. 11 in the form approximate to a laid out pattern on a semiconductor substrate. Referring to the diagram, both of the inverter transistors 38a and 39a are provided with their gates extending along the ground line ls. The access transistors 36a and 37a are provided in the upper portion of the diagram with respect to the inverter transistors 39a and 38a, respectively. The power supply line lv to which the supply potential Vcc is applied is provided in parallel with the ground line ls. Therefore, the resistors 40a and 41a are provided on the sides of the inverter transistors 38a and 39a, respectively.

FIG. 13 is a partial plan view showing a typical layout for the memory cell shown in FIG. 11 to be practically formed on a P-type semiconductor substrate. FIGS. 14A and 14B are sectional views of a memory cell formed in the layout of FIG. 13 and taken along lines A-B and C-D in FIG. 13. In the diagrams, numerals and characters parenthesized with ( ) represent the corresponding portions in FIG. 11.

As shown in FIG. 13, the word line 25a is formed of the same first polycrystalline silicon layer (hatching portion) as forming gates 110 and 120 of the access transistors 36a and 37a. Also, gates 130 and 140 of the inverter transistors 39a and 38a are formed of the first polycrystalline silicon layer. It is to be noted here, however, that the portion of the first polycrystalline silicon layer forming the gates 130 and 140 of the inverter transistors 39a and 38a is not connected to the portion of the same forming the gates 110 and 120 of the access transistors 36a and 37a. The interconnection lv for connecting the supply potential Vcc and the high resistances 40a and 41a, and the high resistances 40a and 41a are formed of a second polycrystalline silicon layer (enclosed by solid line). As shown in FIG. 14A, the high resistance 40a is located over the gate 130 of the inverter transistor 39a. The gate 130, the source 230 and the drain 330 of the inverter transistor 39a and the resistor 40a are insulated by an insulating film formed of SiO$_2$. Likewise, the resistor 41a is formed above the inverter transistor 38a with an insulating film extending therebetween. A cross-coupling interconnection for connecting the drain 330 of the inverter transistor 39a and the gate 140 of the inverter transistor 38a shares an n+-diffused layer region (enclosed by dotted line) with a source 220 and a drain 320 of the access transistor 37a. A cross-coupling interconnection for connecting the gate 30 of the inverter transistor 39a and a drain 340 of the inverter transistor 38a is formed of a second polycrystalline silicon layer connected in a region 410 to both the first polycrystalline silicon layer forming the gate 130 of the inverter transistors 39a and to the n+-diffused layer region forming the source 220 and the drain 320 of the access transistor 37a. The storage nodes N10a and N11a are formed as regions 420 and 430, respectively, where the first and the second polycrystalline silicon layers and the n+-diffused layer region overlap one upon another. As shown in FIG. 14B, the portion of the second polycrystalline silicon layer forming the interconnection lv between the supply potential Vcc and the high resistances 40a and 41a is connected to the supply potential Vcc, and the portion of the n+-diffused layer region forming the sources 230 and 240 of the inverter transistors 39a and 38a is connected to the ground potential GND. Therefore, the ground line ls is formed of the n+ diffused layer. Also the power supply line lv and the ground line ls are insulated from each other by the insulating film formed of SiO$_2$. In FIGS. 14A and 14B, SOP represents an isolation region.

Other memory cells unshown in FIG. 11 are also formed on the semiconductor substrate in the layout as shown in FIG. 13, where the sources of the two inverter transistors contained in one memory cell and those of the memory cells adjacent to the former in the column direction are formed of a common impurity-diffused layer. In FIG. 11, therefore, the sources of the transistors 38a and 39a in the memory cell 21a and those in the memory cell adjacent to the former on its upper side are connected through the connection line ls formed of the impurity-diffused layer. Therefore, in the memory cell 21a and the memory cell adjacent thereto in the column direction, connection nodes between the sources of the corresponding inverter transistors are represented in FIG. 13 as portions N50 and N51 of the impurity-diffused layer forming the ground line ls. Meanwhile, the impurity-diffused layer forming the ground line ls is shared by memory cells arranged in the same row. Accordingly, also the sources of the inverter transistors in the memory cells adjacent in the row direction are connected by the impurity-diffused layer.

As described above, the connection line ls to which the ground potential GND is to be applied is formed of the same impurity-diffused layer as forming the sources of the inverter transistors 38a and 39a. In FIG. 11, therefore, the sources of the inverter transistors 38a and 39a are connected to the ground potential GND practically through resistance of the impurity-diffused layer.

FIG. 15 is a circuit diagram showing an equivalent circuit of two memory cells adjacent in the column direction, taking this resistance into consideration. In the diagram, circuit structure of memory cells 21a and 21b and their peripheral portions is the same as that shown in FIG. 11. The sources of the inverter transistors 38a and 38b corresponding to each other in the adjacent memory cells 21a and 21b are connected at a node N50 formed of the same impurity-diffused layer as forming those sources, to be further connected to ground potential GND through a resistance 50 of the impurity-diffused layer. Likewise, the sources of the inverter transistors 39a and 39b are connected at another node N51 formed of the same impurity-diffused layer as forming those sources, to be further connected to the ground potential GND through resistances 50 and 51 of the impurity-diffused layer. Another resistor 52 also represents resistance of the impurity-diffused layer forming the connection line ls, and is connected to the sources of the inverter transistors contained in the memory cells adjacent to the memory cells 21a and 21b, respectively, in the row direction.

Assume now that the word line 25b is selected when potential of the nodes N10a and N11a in the memory cell 21a are at the high and the low levels, respectively, and also potential of the nodes N10b and N11b in the memory cell 21b are at the high and the low levels, respectively. The following description will be made with reference to FIG. 2 as well. FIG. 2 is a diagram showing potential change at the nodes N 10a, N11a and N51, respectively, in the case described above, where the axis of abscissas represents time and the axis of ordinates represents potential. Meanwhile, since FIG. 2 shows both cases of a conventional SRAM and that of an embodiment, reference to the diagram will be made again in "Description of the Preferred Embodiments".

In this case, when the word line 25b is selected, the access transistors 36b and 37b in the memory cell 21b are rendered conductive. At this moment, the inverter transistor 39b is in the conductive state due to the high-level potential of the node N10b, while the inverter transistor 38b is in the non-conductive state due to the low-level potential of the node N11b. This causes current flow of about 0.15 mA from the supply line 22 to the ground potential source GND through a path linking the bit line loading transistor 29, the bit line 24, the access transistor 37b the inverter transistor 39b, the resistance 51 and the resistance 50. Resistance value of the resistance 51 is about 100 Ω. Therefore, between the nodes N50 and N51, there occurs a voltage drop of about 0.15 mA × 100 Ω, or 15 mV due to the resistance 51. Accordingly, the source potential of the inverter transistors 38a and 39a and the inverter transistors 38b and 39b in practice does not become equal to the ground potential GND. As a result, the source potential of the inverter transistors 39a and 39b (potential of the node N51) becomes higher than that of the inverter transistors 38a and 38b (potential of the node N50) by about 15 mV and thus above the ground potential GND, as shown in FIG. 2(c). Since at this moment, the inverter transistor 39a in the memory cell 21a is in the conductive state due to the high-level potential of the node N10a, the potential rise at the node N51 is transmitted to the node N11a through the inverter transistor 39a. As a result, also the potential of the node N11a becomes about 15 mV as shown in FIG. 2(c). The potential thus raised of the node N11a is applied to the gate of the inverter transistor 38a which has been in the non-conductive state due to the previous low-level potential of the node N11a. A normal MOSFET is not rendered conductive by such a gate potential rise of about only 15 mV. Therefore, if the inverter transistor 38a has been properly fabricated, it can be held in the non-conductive state irrespective of the potential rise at the node N11a. However, if the inverter transistor 38a has an abnormal low threshold voltage due to some defect caused in its fabrication process, the potential rise at the node N11a brings the transistor 38a into a lightly conductive state. The lightly conductive inverter transistor 38a has a significant conducting resistance, while the resistance 40a has been set to have a considerably large resistance value of about $10^{12} \Omega$ so as to reduce stand-by current of the SRAM. Therefore, when the conducting resistance of the lightly conductive inverter transistor 38a gets to approximately the same value as the resistance value of the resistance 40a, the high-level potential Vcc of the node N10a is reduced to a lower value which is obtained by dividing the voltage between the supply potential Vcc and the node N50 according to the ratio between the resistance 40a and the conducting resistance of the lightly conductive inverter transistor 38a. This means that the node N10a is discharged through the lightly conductive inverter transistor 38a. This discharge occurs at a speed depending on a time constant which is determined by the product of the parasitic capacitance value of the node N10a and the conducting resistance of the lightly conductive inverter transistor 38a. Therefore, if the inverter transistor 38a has any defect, the potential rise at the node N11a causes potential fall of the node N10a to begin at the time t0 as indicated by ② in FIG. 2(a), and at a discharging speed determined by the time constant described above. When the potential of the node N10a falls below the threshold voltage Vth of the inverter transistor 39a at the time t2, the inverter transistor 39a is brought from the conductive state into the non-conductive state so that the potential of the node N11a begins to rise due to the supply potential Vcc. Following this, the lightly conductive inverter transistor 38a is rendered completely conductive, so that the potential of the node N10a begins to fall more sharply toward the ground potential GND. As a result, the potential of the node N11a begins to rise at the time t2, as indicated by ④ in FIG. 2(b). By contrast, the potential of the node N10a begins to fall more sharply than before at the time t2, as indicated by ② in FIG. 2(a). That is, after the time t2, the two inverter transistors 38a and 39a in the memory cell 21a are inverted in their state (conductive/non-conductive). This means that the storage data in the memory cell 21a begins to be inverted. As a result, the potential difference between the nodes N10a and the N11a becomes small. As previously described, data reading from a memory cell is effected by detecting the potential difference between the two storage nodes of the memory cell, through the corresponding bit line pair. Therefore, if the memory cell 21b remains in the selected state for more than the time period t2 to t0 which is taken between the beginning of the potential fall at the node N10a and the beginning of the data inversion in the memory cell 21a, the potential difference between the nodes N10a and N11a becomes considerably small. If the data in the memory cell 21a is to be read out thereafter, therefore, the storage data nay be inverted before read out, and this means malfunction of the SRAM.

Assume next that the memory cells 21a and 21b have storage data contrary to those in the case described above, or the potential of the nodes N10 and N11a in the memory cell 21a is at the low and the high levels, respectively, and the potential of the nodes N10b and N11b in the memory cell 21b is at the low and the high levels, respectively. In this case, if the inverter transistor 39a has an abnormal low threshold voltage, the potential of the node N11a falls as the data in the memory cell 21b is read out, causing the same phenomena as in the case described above.

Contrary to the two cases above, if data is read out from the memory cell 21a with the inverter transistor 38b or 39b in the memory cell 21b having an abnormal low threshold voltage, such inversion of storage data will occur in the memory cell 21b.

As has been described above, if an inverter transistor has any defect, the potential difference between the two storage nodes in the memory cell containing the defective inverter transistor is reduced in case of data reading from any other memory cell adjacent to the memory cell in the column direction. This leads to malfunction of the SRAM. Therefore, a completed SRAM has to be examined as to whether or not each memory cell contains inverter transistors with normal threshold voltage. For this reason, SRAM's are subject to a test after fabrication. The test is conducted to identify such phenomena as described above in the following manner. That is, the identical data is in advance stored in two memory cells adjacent to each other in the column direction and then one memory cell is put in the selected state for a certain time. Subsequently, the data in the other memory cell adjacent in the column direction is read out and examined as to whether or not it is the same data as that stored in advance. In the following, the test as described above is called a disturb test. The certain time as described above should be set long enough for the potential of a storage node to fall, due to any defect in an inverter transistor, to a value which might cause malfunction of the SRAM. The time required for the potential fall of the storage node due to the defective inverter transistor is substantially equal to a discharge time constant $\tau$ which is given by the product of $R \times C$, where C represents the parasitic capacitance value of the storage node and R represents the conducting resistance value of the inverter transistor connected to the storage node. Since the parasitic capacitance of a storage node is generally about 0.1 pF, if the conducting resistance value of the lightly conductive inverter transistor is about $10^{12}\Omega$, the certain time as described above is 0.01 pF $\times 10^{12}\Omega$, or about 10 ms. Thus, it is examined in about 10 ms whether or not one of the two inverter transistors contained in each memory cell in one row has a normal threshold voltage. Likewise, to examine whether or not the other of the two inverter transistors contained in each memory cell in one row has a normal threshold voltage, inverted data of that for examining whether or not the above-mentioned inverter transistor has a normal threshold voltage is applied to each memory cell in advance. Accordingly, if all the memory cells in one row are simultaneously tested, all the inverter transistors contained therein are checked for their threshold voltage in 10 ms $\times$ 2, or 20 ms. Therefore, to check the inverter transistors in all the memory cells contained in one SRAM for their threshold voltage, the disturb test is conducted taking 20 ms for each row in the memory cell array.

In order to avoid the reduction in operating speed of SRAM's which is caused by an increased number of memory cells contained in a single SRAM, and achieve a higher-speed operation of SRAM's, large-capacity SRAM's generally have a memory cell array divided into a plurality of blocks which operate independently of one another. The disturb test as described above is performed for each block in such a block-divided type SRAM to check the threshold voltage of the inverter transistors in all the memory cells contained therein.

For a completed SRAM, there are several other tests to be conducted besides the disturb test. As one of such tests, possible disconnection of the two high resistances contained in a memory cell is examined. For this test, Japanese Patent Laying-Open No. 61-280095 describes a method of reducing the test time by performing data writing to the memory cells for testing, with a supply potential lower than usual being supplied to the bit lines.

The progress in fabrication technology of semiconductor integrated circuits and the demand of users for lower prices have accelerated the development of highly integrated SRAM's, increasing the integration level at the rate of about fourfold for 3 years, so that SRAM's of 1M ($10^6$)-bit capacity are now being put to practical use. This leads to, however, increased test times taken for determining whether or not each memory cell functions properly.

Generally, when a memory cell does not function at all, the failure can be identified in a relatively short time. However, when such a functional failure is caused by a combination of several conditions such as ambient temperature of the memory cells, operation cycle of supply voltage, patterns of data written in a plurality of memory cells, and addressing order for the memory cells, it takes a considerable time only to identify such conditions and then to perform several tests. Especially for the time taken by the actual tests that are performed after the identification of conditions, it takes generally more and more time in proportion to the increasing number of memory cells contained in a single SRAM. The above-mentioned disturb test is among those tests involved in such a problem.

Assume, for example, that the disturb test as described above is applied to a 1M-bit SRAM having a memory cell array divided into 32 blocks. The time required to check the threshold voltage of the inverter transistors in all the memory cells is given by the expression; the row number in one block (256 rows) $\times$ the time required to check the threshold voltage of the inverter transistors contained in one-row memory cells in one block (20 ms) $\times$ the block number (32 blocks), or 16.4 seconds. This means that it takes a relatively long time, 16.4 seconds to perform only one test for a single SRAM. The thus increased time required for one test will inevitably increase the time taken for a series of tests applied to a completed large-capacity SRAM.

Meanwhile, a method of detecting a semiconductor integrated circuit device with abnormal characteristics through a simple short-time test has been recently proposed, for example, in U.S. Ser. No. 487,055. In this method, the substrate voltage of a semiconductor integrated circuit device is switched between test operation mode and normal operation mode.

Further, a conventional SRAM may comprise two power terminals. One power terminal receives a voltage for driving the memory cell portion. The other power terminal receives a voltage for driving a peripheral circuit of the memory cell portion. Such an SRAM is described in the document titled "1977 Mitsubishi Integrated Circuit Databook < LSI >" Vol. 5 pp. 3-6.

SUMMARY OF THE INVENTION

An object of the present invention is to decrease the total time for testing a static-type semiconductor memory device.

Another object of the present invention is to decrease the time required to perform a disturb test on a static-type semiconductor memory device.

Still another object of the present invention is to perform a quick determination of whether each memory cell in a static-type semiconductor memory device functions normally or not.

To achieve the objects as described above, a static-type semiconductor memory device according to the present invention comprises a plurality of memory cells arranged in a matrix of rows and columns, each cell being constituted of a flip-flop, a designating circuit for outputting a first signal designating a normal operation mode of the semiconductor memory device and outputting a second signal designating at least one test operation mode of the semiconductor memory device, and a drive voltage generating circuit provided to the plurality of memory cells for generating first and second drive voltages to drive the memory cells.

The drive voltage generating circuit is responsive to a normal mode designating output from the designating circuit for generating the first drive voltage, and responsive to a test mode designating output from the designating circuit for generating the second drive voltage. The drive voltage generating circuit generates a plurality of drive voltage of different levels.

As described above, in the static type semiconductor memory device according to the present invention, these plurality of drive voltages, generated by the drive voltage generating circuit, are selectively generated in response to output from the designating circuit which designates the normal mode and the test mode(s). Therefore, in the static-type semiconductor memory device according to the present invention, different drive voltages can be supplied to the memory cells in the normal mode and the test mode(s).

According to a preferred embodiment of the present invention, the designating circuit designates one normal mode and one test mode, and the drive voltage generating circuit comprises a first drive voltage generating and applying circuit responsive to the normal mode designating output from the designating circuit for generating a first drive voltage and applying the same to the plurality of memory cells, and a second drive voltage generating and applying circuit responsive to the test mode designating output from the designating circuit for generating a second drive voltage lower than the first one and applying the same to the plurality of memory cells.

According to a more preferred embodiment of the present invention, the first drive voltage generating and supplying circuit comprises a first P-channel MOS transistor provided between a voltage source which supplies a relatively high voltage, and a memory cell driving connection line which transmits the drive voltage to the plurality of memory cells. The first P-channel MOS transistor has a control terminal receiving the normal mode designating output from the designating circuit. Furthermore, according to the present preferred embodiment, the second drive voltage generating circuit comprises an N-channel MOS transistor and a second P-channel MOS transistor which are connected in series and provided between the voltage source and the memory cell driving connection line. The N-channel MOS transistor is connected to the side of the voltage source. The N-channel MOS transistor has a control terminal receiving supply voltage from the voltage source or a given voltage lower than that. The second P-channel MOS transistor has a control terminal receiving the test mode designating output from the designating circuit which has a logical level contrary to that of the normal mode designating output.

In this case, therefore, the memory cells are driven, in the normal mode, by a voltage of equal level with the supply voltage from the voltage source, and in the test mode, by a voltage lower than the supply voltage of the voltage source by the threshold voltage of the N-channel MOS transistor or by an even lower voltage. In the test mode, the memory cells are driven by a lower voltage than in the conventional case so that also the potential of the storage nodes in the memory cells maintaining the H-level in the test mode is reduced. Therefore, when a disturb test is applied to a memory cell comprising one inverter transistor with an abnormally low threshold voltage, potential of one storage node begins to fall from a lower level than in the conventional case when potential of the other storage node begins to rise. Accordingly, the falling potential of the one storage node becomes lower than the threshold voltage of the other inverter transistor in the ON-state more quickly than in the conventional case. That is, the one inverter transistor in this memory cell is switched from the OFF-state to the ON-state more quickly than in the conventional case. Therefore, also the other inverter transistor is switched from the ON-stage to the OFF-state more quickly than in the conventional case. As a result, in the disturb test, the storage data in this memory cell is inverted in a shorter time than in the conventional case.

According to another preferred embodiment of the present invention, the designating circuit designates one normal mode and a plurality of test modes, and the second drive voltage generated from the drive voltage generating circuit includes a plurality of drive voltages each of which is lower than the first drive voltage and corresponds to one of the plurality of test modes. Furthermore, the drive voltage generating circuit is responsive to the normal mode designating output from the designating circuit for generating the first drive voltage and applying the same to the plurality of memory cells, and responsive to each of the plurality of test mode designating outputs from the designating circuit for generating the corresponding drive voltage and applying the same to the plurality of memory cells.

As has been described above, according to the present invention, the drive voltage supplied to the memory cell driving connection line in the test mode can be set lower than that in the normal mode, so that a memory cell comprising an inverter transistor with an abnormal threshold voltage can be detected in a shorter time than in the conventional case. As a result, the time required for applying the disturb test to the static-type semiconductor memory device is shortened.

Further, according to the present invention, the drive voltage to be supplied to the memory cell driving connection line in the test mode can be selected from the plurality of drive voltages of different levels, so that it becomes possible to perform tests on the inverter transistors contained in the memory cells or to test the static-type semiconductor memory device under the several conditions.

To achieve the objects as described above, an operating method of a static-type semiconductor memory device according to the present invention, which is applied to a static-type semiconductor memory device comprising a plurality of memory cells arranged in a matrix of rows and columns, each memory cell including a flip-flop, comprises the steps of selectively designating a normal mode and a test mode, supplying a first drive voltage to the plurality of memory cells in response to the selective designation of the normal mode, and supplying a second drive voltage lower than the first one to the plurality of memory cells in response to the selective designation of the test mode. In the operating method of a static-type semiconductor memory device according to the present invention, therefore, the drive voltage supplied to the memory cells in the test mode can be set lower than that in the normal mode. As a result, any test which depends on the drive voltage for its time required (for example, the disturb test) can be completed at a higher speed than in the conventional case.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram showing a test signal generating circuit according to still another embodiment of the present invention.

FIGS. 5A to 5D are waveform charts for explaining operation of the test signal generating circuit shown in FIG. 4.

FIG. 6 is a circuit diagram showing a test signal generating circuit and a power circuit for test mode/normal mode according to a further embodiment of the present invention.

FIG. 7 is a table of truth value for explaining operation of the test signal generating circuit shown in FIG. 6.

FIG. 8 is a circuit diagram showing a specific example of the high voltage detecting circuit shown in FIG. 6.

FIGS. 9A and 9B are timing charts for explaining operation of the high voltage detecting circuit shown in FIG. 8.

DESCRIPTION OF THE PREFERRED EMBODIMENTS

Figure 1:
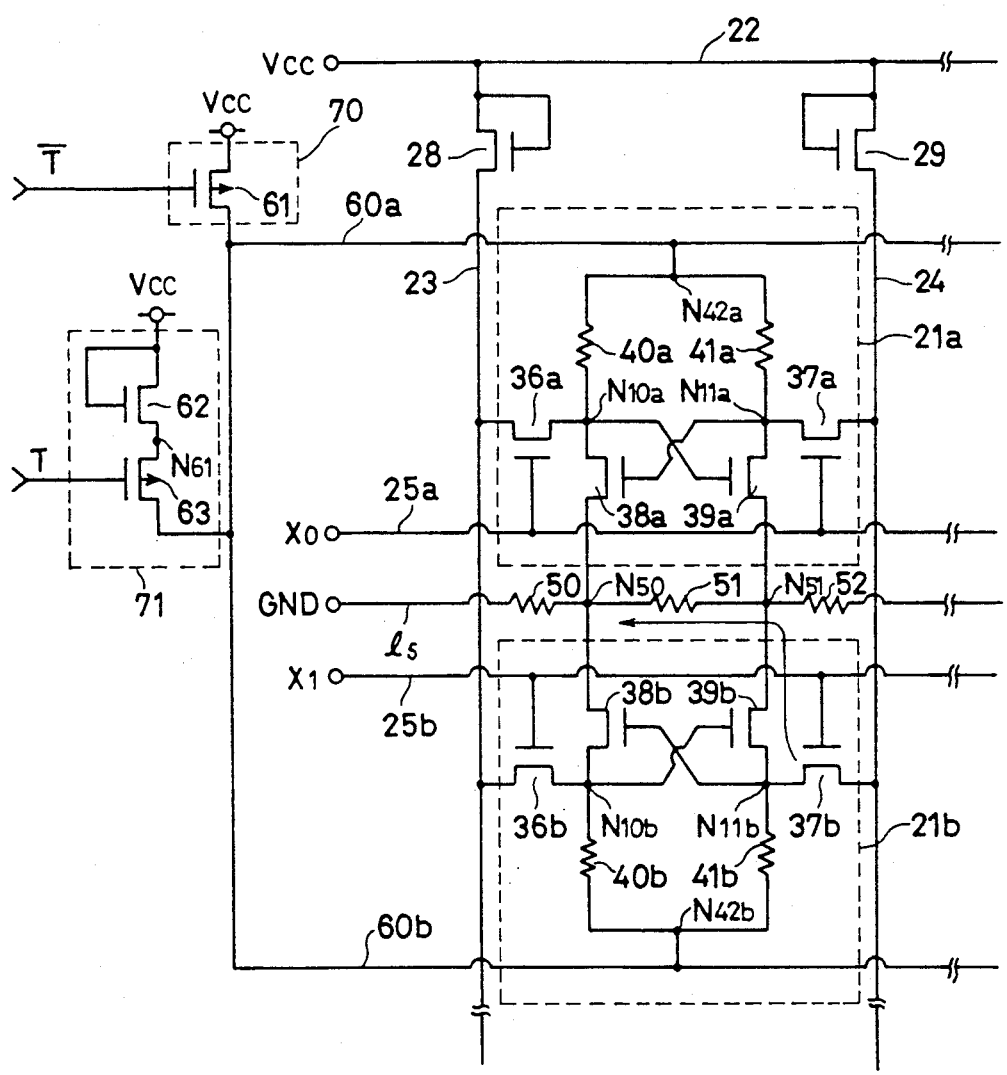
FIG. 1 is a circuit diagram showing part of an SRAM according to an embodiment of the present invention.
Figure 13:
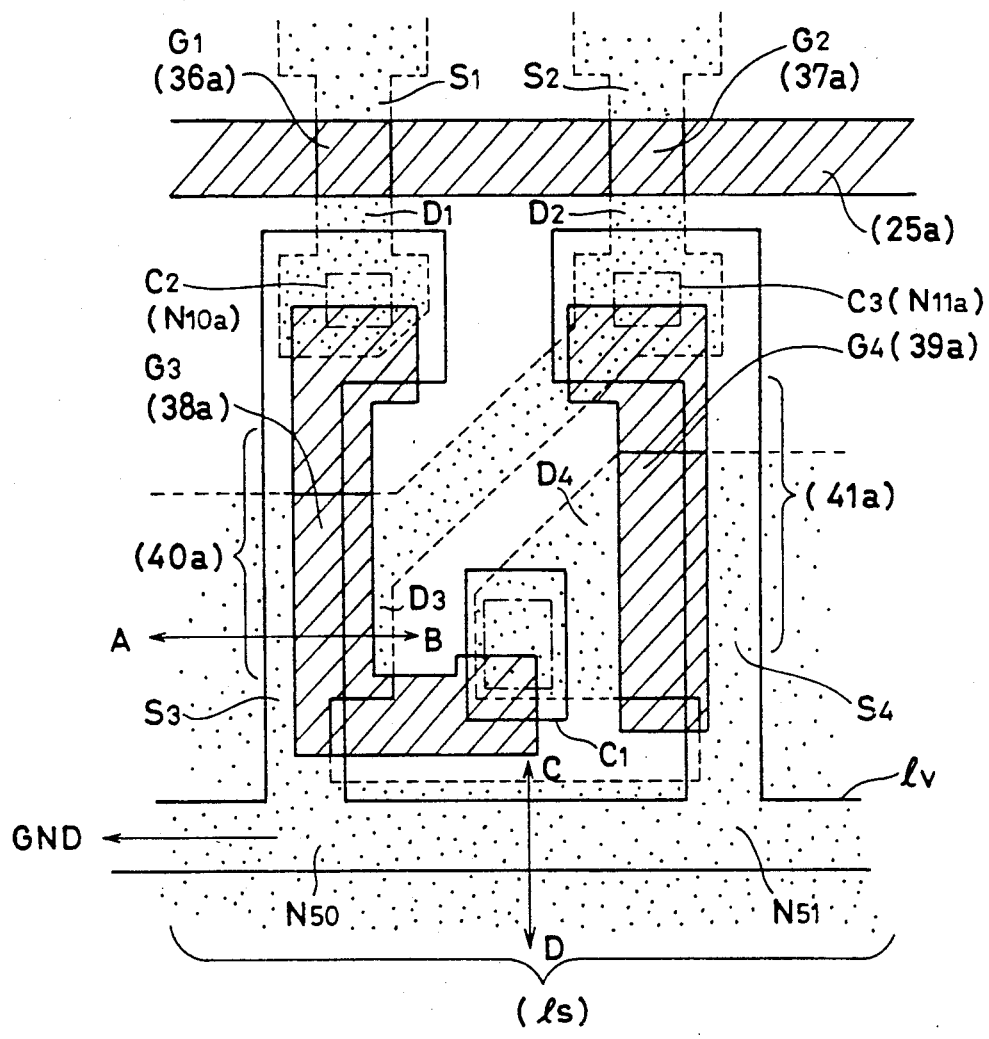
FIG. 13 is a plan view showing layout of a memory cell formed on a semiconductor substrate.
Figure 15:
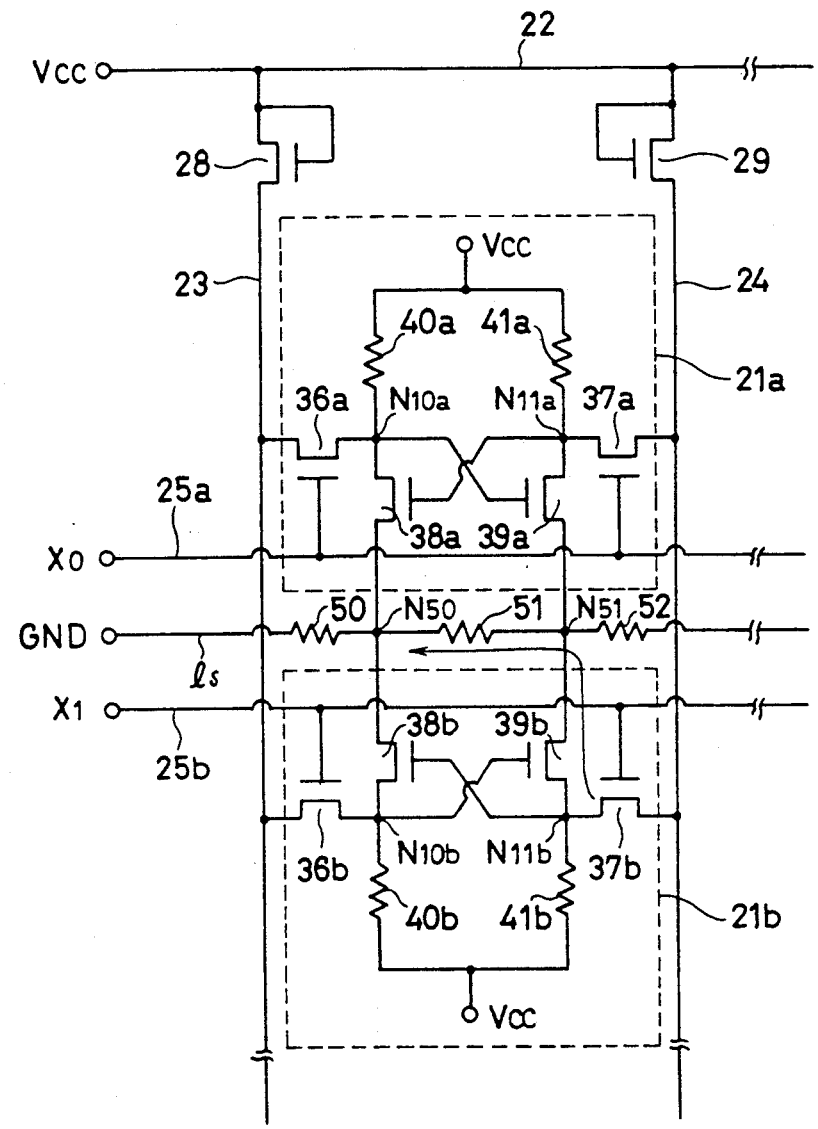
FIG. 15 is a circuit diagram showing an equivalent circuit of memory cells adjacent in the column direction in a conventional SRAM, taking resistance in consideration.

FIG. 1 is a circuit diagram showing part of an SRAM according to an embodiment of the present invention. More specifically, FIG. 1 shows an equivalent circuit of two memory cells adjacent in the column direction and their peripheral portions. The basic internal structure of the memory cells 21a and 21b and their connection relationship with bit lines and word lines are the same as those shown in FIG. 15. Further, the layout for these memory cells to be formed on a semiconductor substrate is the same as that shown in FIG. 13.

The memory cell 21a is provided between bit lines 23 and 24 and comprises access transistors 36a and 37a having the gates connected to a word line 25a, inverter transistors 38a and 39a constituting a flip-flop, and high resistances 40a and 41a. Likewise, the memory cell 21b is provided between the bit lines 23 and 24 and comprises access transistors 36b and 37b having the gates connected to a word line 25b, inverter transistors 38b and 39b constituting a flip-flop, and high resistances 40b and 41b. The sources of the inverter transistors 38a and 39a in the memory cell 21a and the sources of the inverter transistors 38b and 39b in the memory cell 21b are connected to a ground line ls which includes resistances 50, 51 and 52 produced by the common impurity-diffused layer forming those sources. The bit lines 23 and 24 are connected, as in the conventional case, through bit line loading MOSFET's 28 and 29 to a connection line 22 receiving supply potential Vcc.

Unlike the conventional case, however, those ends of the resistances 40a and 41a in the memory cell 21a that are not connected to the inverter transistors and also those ends of the resistances 40b and 41b in the memory cell 21b that are not connected to the inverter transistors are connected through connection lines 60a and 60b, respectively, together to a power circuit 70 for normal mode and a power circuit 71 for test mode which supply drive voltages to the memory cells for driving them. These connection lines are referred to as memory cell driving connection lines hereinafter.

Meanwhile, the structure of other unshown memory cells and the layout with which they are formed on a semiconductor substrate are the same as those for these memory cells 21a and 21b, and further, other unshown portions of this SRAM are the same as those in the conventional case. It is to be noted here, however, that in this SRAM, there is provided an additional external terminal for receiving a test signal T as will be described later. In the normal mode, this SRAM operates in the same manner as a conventional one.

The power circuit 70 for normal mode comprises a P-channel MOSFET 61 provided between the supply potential Vcc and the signal lines 60a and 60b connected to the memory cells.

The power circuit 71 for test mode comprises an N-channel MOSFET 62 and a P-channel MOSFET 63 which are connected in series between the supply potential Vcc and the signal lines 60a and 60b connected to the memory cells. The MOSFET 62 is diode-connected.

The gate of the MOSFET 63 in the power circuit 71 for test mode receives the test signal T from the above-mentioned external terminal, and the gate of the MOSFET 61 in the power circuit 70 for normal mode receives an inverted signal $\overline{T}$ of the test signal T.

When the disturb test is conducted on the SRAM, a low-level signal is applied to the SRAM as the test signal T from the external terminal. This makes the MOSFET 63 in the power circuit 71 for test mode conductive, so that potential of a connection node N61 between the MOSFET's 62 and 63 is supplied to the memory cell driving connection lines 60a and 60b. Since the MOSFET 62 is always in the conductive state due to the supply potential Vcc received at the gate, the potential at the node N61 is given as Vcc − Vth, a voltage lower than the supply potential Vcc by the threshold voltage Vth of the MOSFET 62. Meanwhile, the MOSFET 61 in the power circuit 70 for normal mode receives an inverted signal of the low-level test signal T, or a high-level signal $\overline{T}$ at its gate to be rendered non-conductive. Accordingly, not the supply potential Vcc but the potential from the power circuit 71 for test mode is applied to the memory cell driving connection lines 60a and 60b. Therefore, in the disturb test, the drive voltage Vcc − Vth which is lower than that in the conventional case is supplied to the memory cells 21a and 21b.

Now, in the disturb test, the memory cells 21a and 21b have the same data written therein. In the following description, it is assumed that potential of the nodes N10a and N10b is at the high level and potential of the nodes N11a and N11b is at the low level, due to those written data. In this case, when the low-level test signal T causes potential of a node N42a at ends of the resistances 40a and 41a and of another node N42b at ends of the resistances 40b and 41b to fall to the lower potential Vcc − Vth under the influence of the power circuit 71 for test mode, potential of the nodes N10a and N10b falls correspondingly. On the other hand, since the inverter transistors 39a and 39b are in the conductive state, potential of the nodes N11a and N11b is substantially fixed at the potential of a node N51 connected to ground potential GND, through the inverter transistors 39a and 39b, respectively. That is, by making potential of the nodes N42a and N42b lower than usual in the test mode, potential of the nodes N10a and N10b is set to a lower level than in the conventional case. Subsequently, it is assumed that the word line 25b has been selected to perform the disturb test for the memory cell 21a in the state described above. For the description, reference will be made to FIG. 2.

Figure 2:
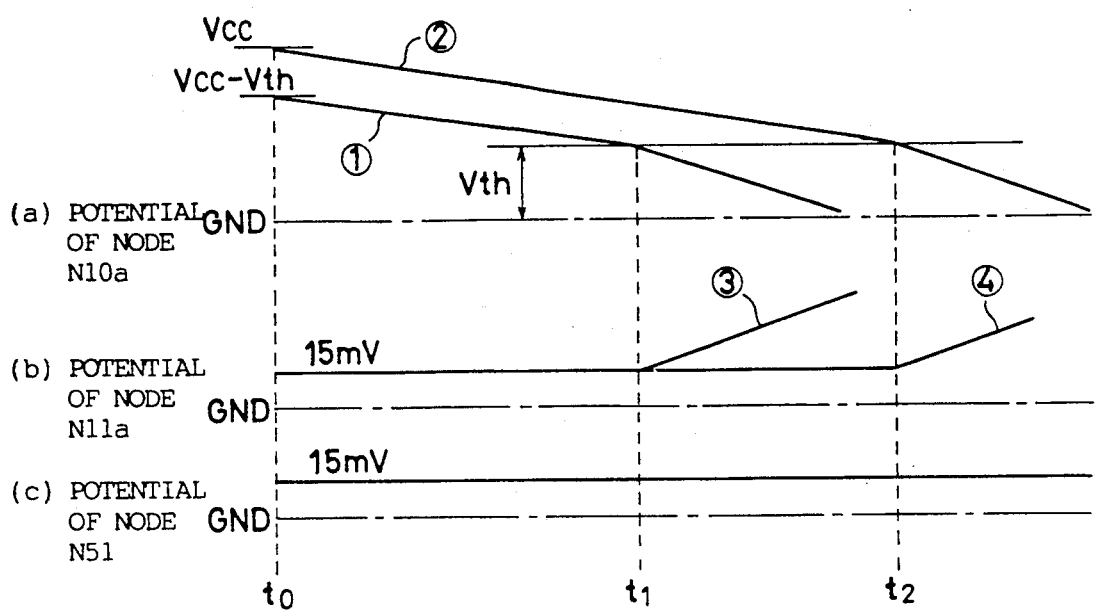
FIG. 2 is a waveform chart for explaining characteristic differences between a conventional SRAM and an SRAM according to the present invention in the disturb test.

In this case, the access transistors 36b and 37b in the memory cell 21b are rendered conductive, causing the same phenomena as in the conventional case. That is, current flows from the connection line 22 to the ground potential GND through the bit line loading MOSFET 29, the bit line 24, the access transistor 37b, the inverter transistor 39b, and the resistances 51 and 50, raising potential of the node N51 to about 15 mV. In this manner, when the word line 25b is in the selected state, the potential of the node N51 is fixed at a potential (about 15 mV) higher than the ground potential GND, as shown in FIG. 2 (c). The thus raised potential of the node N51 is transmitted to the node N11a through the inverter transistor 39a so that the potential of the node N11a rises to about 15 mV as in the conventional case. Therefore, when the threshold voltage of the inverter transistor 38a is abnormally low, the inverter transistor 38a is put in a lightly conductive state so that the potential of the node N10a begins to fall as indicated by ① in FIG. 2 (a). When the potential of the node N10a falls below the threshold voltage Vth of the inverter transistor 39a, the inverter transistor 39a is switched from the conductive state to the non-conductive state so that the potential of the node N11a begins to rise under the influence of the high potential of the node N42a. Following this the inverter transistor 38a shifts from the lightly conductive state into the completely conductive state so that the potential of the node N10a begins to fall sharply toward the ground potential. In this manner, the potential of the node N11a begins to rise at the time t1 when the falling potential of the node N10a reaches the threshold voltage Vth of the inverter transistor 39a, as indicated by ③ in FIG. 2 (b). On the other hand, the falling potential of the node N10a begins to fall more sharply than before at the time t1, as indicated by ① in FIG. 2 (a). This means that the inversion of the storage data in the memory cell 21a has begun.

The phenomena as described above are the same as those in the conventional case. Further, the falling speed of potential of the node N10a, which depends on the product of the parasitic capacitance value of the node N10a and the conducting resistance value of the inverter transistor 38a, is substantially the same as that in the conventional case. Correspondingly, the speed of the potential rise at the node N11a which follows the potential fall at the node N10a is substantially the same as that in the conventional case. Referring now to ① and ② in FIG. 2 (a), however, the potential of the node N10a begins to fall from the value Vcc − Vth which is lower than the conventional one. Accordingly, the time t1 to t0 taken by the potential of the node N10a to fall to the threshold voltage Vth of the inverter transistor 39a, or the time required for the inversion of storage data in the memory cell 21a to begin is smaller than the conventional one, t2 to t0. Therefore, the abnormal threshold voltage of the inverter transistor 38a causes in a shorter time the phenomenon that the storage data in the memory cell 21a is inverted. Correspondingly, the time required for maintaining the word line 25b in the selected state so as to identify the phenomenon can be set shorter than that in the conventional case. This means that in the disturb test, the time required to check an abnormal threshold voltage of the inverter transistors contained in one-row memory cells is reduced. As a result, the time taken by the disturb test for one SRAM is reduced.

When not in the test mode as described above, the SRAM receives a high-level input signal through the external terminal as the test signal T. In this case, contrary to the case above, the MOSFET 63 in the power circuit 71 for test mode is rendered non-conductive and the MOSFET 61 in the power circuit 70 for normal mode is rendered conductive. Accordingly, each of the memory cell driving connection lines 60a and 60b receives the supply potential Vcc from the power circuit 70 for normal mode. As a result, potential at the nodes N42a and N42b gets to the supply potential Vcc as in the conventional case. The above-described structure, therefore, will not affect normal operation of the SRAM at all.

Figure 3:
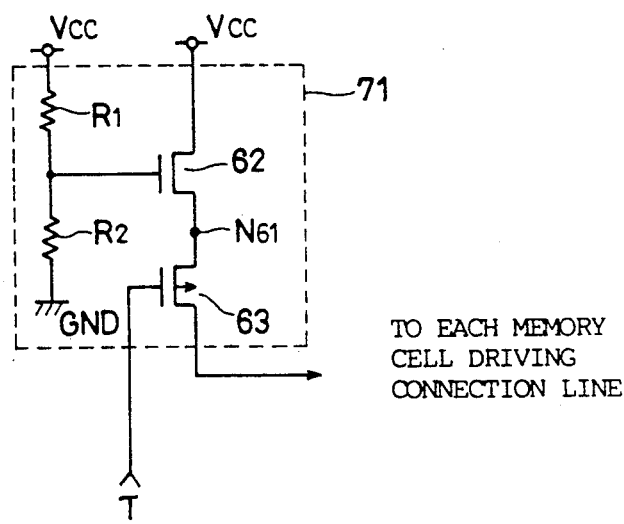
FIG. 3 is a circuit diagram showing a power circuit for test mode according to another embodiment of the present invention.
Figure 11:
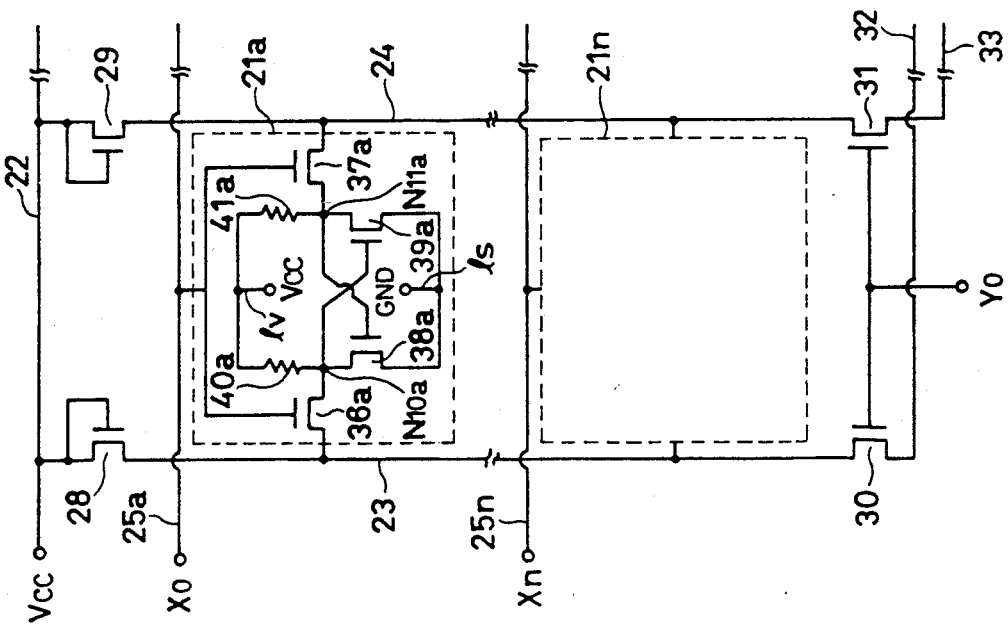
FIG. 11 is a circuit diagram showing one-column memory cells in a memory cell array of a conventional SRAM.
Figure 10:
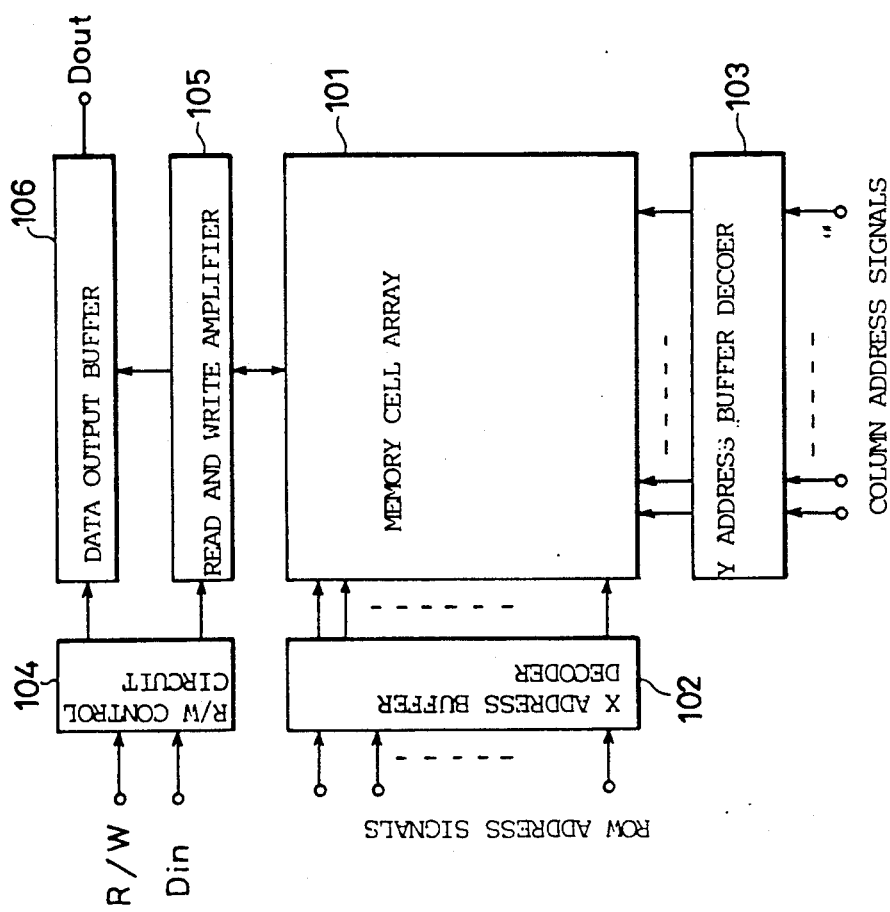
FIG. 10 is a schematic block diagram showing the entire structure of a conventional SRAM.
Figure 12:
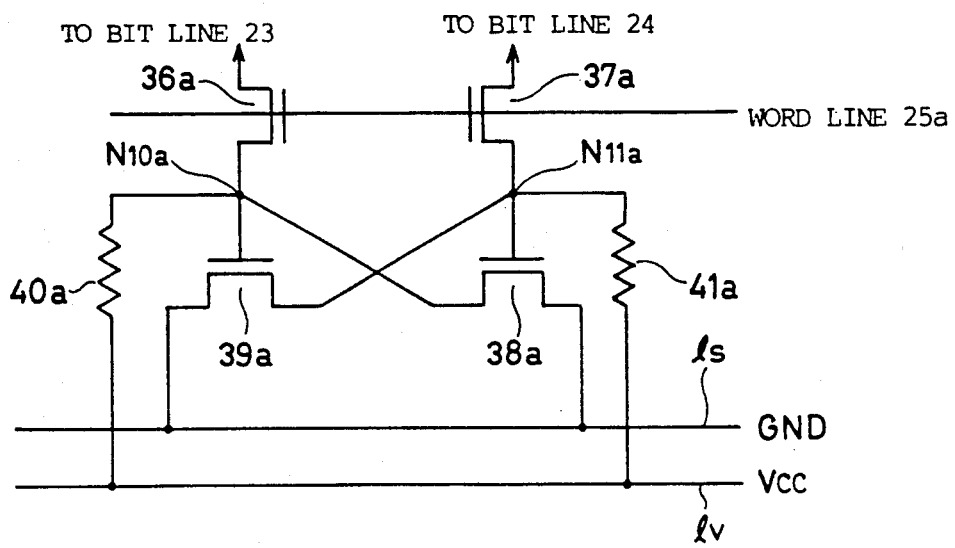
FIG. 12 is a circuit diagram showing structure of a memory cell in an SRAM in a corresponding manner to a practically laid out pattern.
Figure 14B:
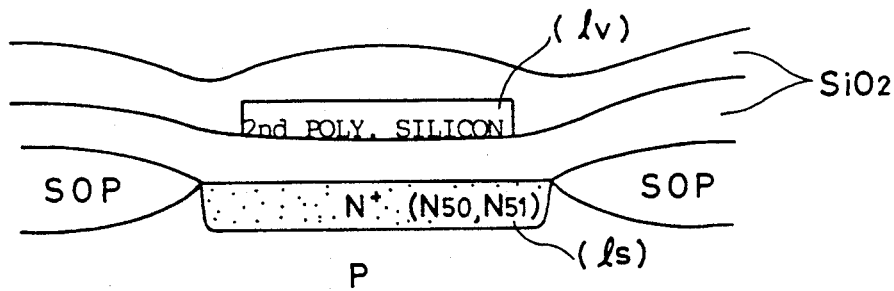
FIGS. 14A and 14B are partial sectional views of a memory cell formed in the layout shown in FIG. 13.
Figure 14A:
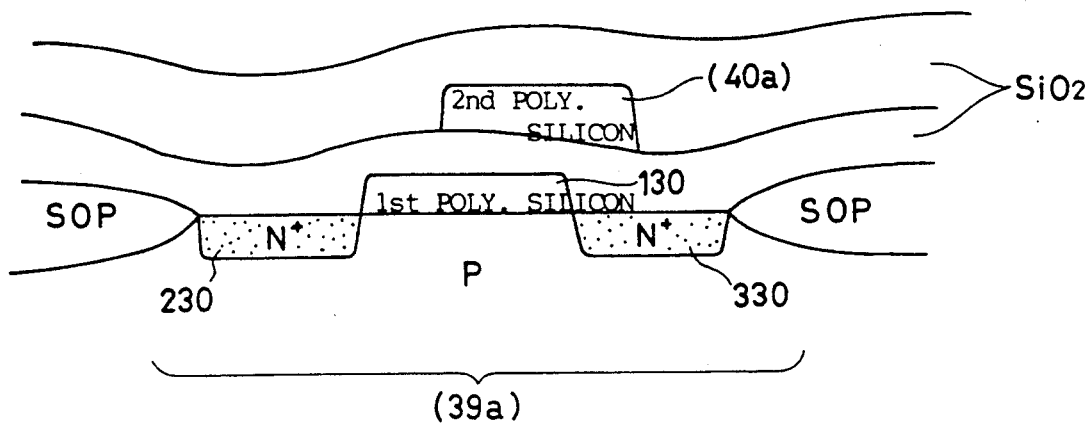

According to the present embodiment, the potential which is lower than the supply potential Vcc by the threshold voltage Vth of the N-channel MOSFET has been applied to each memory cell as a memory cell drive voltage in the test mode, from the power circuit for test mode. The memory cell drive voltage in the test mode, however, can be set to any other potential, if only it is lower than the supply potential Vcc and can hold the data written in the memory cells for the disturb test. FIG. 3 is a circuit diagram showing a power circuit for test mode which can supply any potential in the test mode, according to another embodiment of the present invention. Referring to the diagram, the power circuit 71 for test mode comprises resistances R1 and R2 which are connected in series between supply potential Vcc and ground potential GND, and an N-channel MOSFET 62 and a P-channel MOSFET 63 which are connected in series between the power supply Vcc and each memory, cell driving connection line. The gate of the MOSFET 62 receives potential of a connection node between the resistances R1 and R2, and the gate of the MOSFET 63 receives the test signal T. When resistance values of the resistances R1 and R2 are represented by r1 and r2, respectively, the potential of the connection node therebetween, or the gate potential of the MOSFET 62 is given by $[r2/(r1 + r2)] \times Vcc$, i.e., a value obtained by dividing the supply voltage Vcc according to the ratio between the resistances R1 and R2. Therefore, a connection node N61 between the MOSFET's 62 and 63 is at a potential lower than the gate potential of the MOSFET 62 by the threshold voltage Vth, or $[r2/(r1 + r2)] \times Vcc - Vth$. In the test mode, the test signal T falls to the low-level, rendering the MOSFET 63 conductive, so that the potential of the node N61 is applied to each memory cell driving connection line. Therefore, by selecting appropriate resistance values r1 and r2 for the resistances R1 and R2, the potential supplied from the power circuit 71 for test mode to each memory cell can be set as desired.

While in the two embodiments above, the test signal is entered through the external terminal which has been additionally provided therefor, the test signal may also be generated inside the SRAM. FIG. 4 is a circuit diagram showing a test signal generating circuit which generates the test signal inside an SRAM according to still another embodiment of the present invention. The structure and operation of the test signal generating circuit will be described below. In the following description, reference will be made to FIG. 5 as well. FIG. 5 is a waveform chart showing a process through which the test signal is generated by the test signal generating circuit shown in FIG. 4.

In FIG. 4, the test signal generating circuit 72 comprises a two-input AND gate 75, an inverter 76 for inverting output of the AND gate 75, and a latch circuit 77. The latch circuit 77 comprises a P-channel MOSFET 78 and an N-channel MOSFET 79 which are connected in series between power supply Vcc and ground GND, an inverter 80 for inverting potential at a connection node between the MOSFET's 78 and 79, and an inverter 81 for inverting output of the inverter 80 and outputting the inverted signal as a test signal. The gate of the MOSFET 78 receives output of the inverter 76 as a set signal S for the latch circuit 77, and the gate of the MOSFET 79 receives a one-shot pulse from an unshown power-on detecting circuit as a reset signal R for the latch circuit 77. The power-on detecting circuit has been provided in conventional SRAM's to output the one shot pulse in response to power-on in the SRAM's. Immediately after power is turned on, therefore, the reset signal R attains the high level and holds thereon for a predetermined short period. In response to this, the MOSFET 79 is rendered conductive, causing potential at the input terminal of the inverter 80 to fall to the low level. The low-level signal is outputted as the test signal $\overline{T}$ through the inverters 80 and 81. When the power-on detecting circuit ceases to output the one shot pulse, however, the reset signal R falls to the low level, rendering the MOSFET 79 non-conductive. The potential at the input terminal of the inverter 80 then depends only on the state (conductive/non-conductive) of the MOSFET 78. This means that the latch circuit 77 is momentarily reset in response to power-on. Meanwhile, an inverted signal T of this test signal $\overline{T}$ is applied to the power circuit 71 for normal mode in FIGS. 1 and 3. Further, it is also possible to reset the latch circuit 77 in response to power-on without using the reset signal R. For example, the latch circuit 77 may be configured such that the inverters 80 and 81 have balanced characteristics as allowing the inverter 81 to output a low-level signal in response to power-on, and an output signal of the inverter 76 is directly entered into the inverter 80.

Now, the test signal generating circuit 72 receives potential of an external terminal W, which has been conventionally provided to receive an externally applied write signal, through inverters 73 and 74 conventionally provided for generating an internal write signal, as an internal write signal W'. Further, the test signal generating circuit 72 receives an output signal (referred to as ATD signal hereinafter) of an ATD (Address Transition Detector) circuit 82 which has been conventionally provided in an SRAM and connected to external terminals $A_0, A_1, ... A_n$ for receiving an externally applied address signal. The internal write signal W' and the ATD signal are entered into the AND gate 75 in the test signal generating circuit 72. The ATD circuit 82 has been conventionally provided in an SRAM to detect transition in address signals for outputting a one shot pulse. Meanwhile, it is assumed that when the write signal entered through the external terminal W is at the high level, the SRAM is in the write state, or otherwise when the same is at the low level, the SRAM is in the read state.

When data are sequentially written in a plurality of memory cells, the address signals change for every predetermined period (referred to as write cycle hereinafter), as shown in FIG. 5A. In data writing of a general SRAM, as shown in FIG. 5B, the external write signal does not switch to the high level indicative of the write state until a certain time period $t_{su}$ has passed after the switching of the address signals, for every one write cycle. In the test mode, however, as indicated by broken line in FIG. 5B, the external write signal is raised at an earlier timing than in the normal mode. The internal write signal W' shows substantially the same waveform as this external write signal. Therefore, the internal write signal W' is raised at the earlier timing than in the normal mode for every one write cycle.

Meanwhile, the ATD circuit 82 outputs the one shot pulse in response to a change in the address signals. Accordingly, the ATD signal outputted from the ATD circuit 82 attains the high level immediately after the change of the address signals and holds thereon for a certain period, as shown in FIG. 5C. In the test mode, therefore, the output signal of the AND gate 75 attains the high level immediately after the change in the address signals. This high-level signal is inverted by the inverter 76 to the low level to be applied to the gate of the MOSFET 78 as the set signal S. In response to this, the MOSFET 78 is rendered conductive, transmitting the supply potential Vcc to the input terminal of the inverter 80. The high-level potential applied to the input terminal of the inverter 80 is outputted through the inverters 80 and 81 as the test signal $\overline{T}$. In the test mode, therefore, when the external write signal rises at an earlier timing than in the normal mode, also the test signal $\overline{T}$ rises in response to that. Further, since the output terminal of the inverter 81 and the input terminal of the inverter 80 are connected to each other, once the test signal $\overline{T}$ attains the high level, the high-level signal is held at the input terminal of the inverter 80 and at the output terminal of the inverter 81. That is, the latch circuit 77 is set when a signal rising at a different timing from that in the normal mode is applied to the external terminal W. In the test mode, therefore, when the external write signal rises at an earlier timing than in the normal mode, the test signal $\overline{T}$ rises immediately after the change in the address signals and is held at the high level, as shown in FIG. 5D. Meanwhile, when the write signal rises at a normal timing, the output of the AND gate 75 is at the low level since there is no period for the ATD signal and the internal write signal W' to attain together the high level. In this case, therefore, the test signal $\overline{T}$ remains at the level reached immediately after power is turned on, or at the low level.

As will be understood from the foregoing, in this test signal generating circuit 72, the test signal $\overline{T}$ reaches, in response to power-on, the level which allows the power circuit 70 for normal mode in FIG. 1 to supply its output potential to the memory cells, and when a test begins, shifts to the level which allows the power circuit 71 for test mode in FIGS. 1 and 3 to supply its output potential to the memory cells. Further, during a test period, the test signal $\overline{T}$ remains at the latter level even when the external terminal W receives a normal write signal. Accordingly, it becomes possible to conduct the disturb test with the potential from the power circuit for test mode, which is lower than the supply potential Vcc, being supplied to the memory cells.

In the embodiments above, the supply potential Vcc and a certain potential lower than the supply potential Vcc are switched between the normal mode and the test mode to be applied to the memory cell driving connection lines. Since the threshold voltage and the like of MOSFET's fluctuate depending on external conditions such as temperature, the range of memory cell drive voltages in which SRAM's are operable varies also depending on such external conditions. A more detailed description will be given on this phenomenon.

When the memory cell drive voltage is decreased from the supply potential Vcc toward the ground potential GND and thus falls below a certain potential $V_{LIM}$, the SRAM will no longer be able to operate properly. That is, the range of the memory cell drive voltages allowing proper operation of the SRAM is between the potential $V_{LIM}$ and the supply potential Vcc inclusive. This potential $V_{LIM}$ becomes higher as external temperature of the SRAM is lower. Therefore, the lowest value of the memory cell drive voltage allowing operation of the SRAM becomes closer to the supply potential Vcc under low temperatures than high temperatures. Accordingly, the range of memory cell drive voltages in which the SRAM is operable is narrowed as the external temperature of the SRAM is lower. In the test mode, therefore, the potential to be supplied to the memory cell driving connection lines needs to be changed according to temperatures as well.

Further, the range of threshold voltages of the inverter transistors judged to be defective in the disturb test, where one word line is put in the selected state for a predetermined certain period, fluctuates under the influence of the fluctuating threshold voltages of the MOSFET's caused by the fluctuation in external conditions, and of the memory cell drive voltage. If the memory cell drive voltage in the test mode is single, therefore, even those transistors that could be made available if only their conditions for use are limited may be judged defective. To avoid such a problem, performance of the inverter transistors needs to be severally graded.

Considering the above, a plurality of memory cell drive voltages may be desirably supplied to the memory cells in the test mode. FIG. 6 is a circuit diagram showing a test signal generating circuit and a power circuit for test mode/normal mode in such a case, according to another embodiment of the present invention. FIG. 7 is a diagram showing in the form of a table logic levels of the respective signals for explaining operation of the test signal generating circuit shown in FIG. 6. In FIG. 7, "0" and "1" represent the low and the high levels, respectively.

Referring to FIG. 6, the test signal generating circuit 83 comprises high voltage detecting circuits 84 and 85 connected to external terminals $A_0$ and $A_1$, respectively, for receiving address signals, two-input OR gates 86, 88, 90 and 93, and inverters 87, 89 and 91. In the test mode, at least one of the external terminals $A_0$ and $A_1$ receives a signal of a level outside the potential range for the address signals, or of a higher potential exceeding the potential range for the address signals. The high voltage detecting circuits 84 and 85 detect that the signals received at the external terminals $A_0$ and $A_1$ have higher potentials than the normal level, or potentials exceeding the potential range for the address signals, and then outputs high-level signals as A0' and A1', respectively.

In the normal mode, therefore, the signals A0' and A1' are both at the low level. The signal A0' is applied to the OR gates 86 and 90, and the inverters 87 and 91. The signal A1' is applied to the OR gates 86 and 88 and the inverters 89 and 92. Outputs of the inverters 87 and 89 are applied to the OR gates 88 and 90, respectively, while outputs of the inverters 91 and 92 are applied together to the OR gate 93. When both the signals A0' and A1' are at the low level, therefore, only an output signal T0 of the OR gate 86 which receives those signals as inputs falls to the low level, while output signals T1, T2 and T3 of other OR gates 88, 90 and 93 all attain the high level (see FIG. 7 (a)).

When only the external terminal $A_0$ receives a higher potential than usual, only the output signal A0' of the high voltage detecting circuit 84 attains the high level. In this case, therefore, as shown in FIG. 7 (b), only the output signal T1 of the OR gate 88 which receives an inverted signal of the signal A0' and the signal A1' as input signals falls to the low level.

When only the external terminal $A_1$ receives a signal of higher potential than usual, only the output signal A1' of the high voltage detecting circuit 85 attains the high level. In this case, therefore, as shown in FIG. 7 (c), only the output signal T2 of the OR gate 90 which receives an inverted signal of the signal A1' and the signal A0' as input signals falls to the low level.

When both the external terminals $A_0$ and $A_1$ receive signals of higher potential than usual, the output signals A0' and A1' of the high voltage detecting circuit 84 and 85 attain together the high level. In this case, therefore, as shown in FIG. 7 (d), only the signal T3 of the OR gate 93 which receives the inverted signal of the signal A0' and the inverted signal of the signal A1, as input signals falls to the low level.

The output signals T0 to T3 of the OR gates above are applied as test signals to a power circuit 94 for test mode/normal mode provided between supply potential Vcc and each memory cell driving connection line. In the power circuit 94, the test signals T0 to T3 are applied to the gates of P-channel MOSFET's Q0, Q1, Q2 and Q3, respectively. In the power circuit 94, one N-channel MOSFET Q4 is provided between the MOSFET Q1 and the supply potential Vcc, two N-channel MOSFET's Q5 and Q6 are connected in series between the MOSFET Q2 and the power supply Vcc, three N-channel MOSFET's Q7, Q8 and Q9 are connected in series between the MOSFET Q3 and the power supply Vcc, and the MOSFET Q0 is directly connected to the supply potential Vcc. The MOSFET's Q4 to Q9 are each diode-connected and always in the conductive state. When only the test signal T0 falls to the low level, therefore, only the MOSFET Q0 is rendered conductive, allowing the supply of the supply potential Vcc to a node N62. When only the test signal T1 falls to the low level, only the MOSFET Q1 is rendered conductive, allowing the supply of Vcc − Vth, a potential lower than the supply potential Vcc by the threshold voltage Vth of the MOSFET Q4, to the node N62. When only the test signal T2 falls to the low level, only the MOSFET Q2 is rendered conductive, allowing the supply of Vcc $- 2 \times$ Vth, a potential lower than the supply potential Vcc by the sum of the threshold voltages of the MOSFET's Q5 and Q6, or $2 \times$ Vth, to the node N62. Likewise, when only the test signal T3 falls to the low level, Vcc $- 3 \times$ Vth, a potential lower than the supply potential Vcc by the sum of the threshold voltages of the MOSFET's Q7, Q8 and Q9, or $3 \times$ Vth, is supplied to the node N62. The potential supplied to the node N62 is applied to each memory cell driving connection line as an output potential of the power circuit 94.

When a signal of higher potential than usual is selectively applied to one or both of the external terminals $A_0$ and $A_1$ in the test mode, any of the above-described three potentials that are lower than the supply potential Vcc, i.e., Vcc $-$ Vth, Vcc $- 2 \times$ Vth and Vcc $- 3 \times$ Vth is selectively supplied to the memory cells.

FIG. 8 is a circuit diagram showing a structure of the high voltage detecting circuit 84 shown in FIG. 7. Referring to the diagram, when a potential rendering a diode-connected N-channel MOSFET Q-1 conductive is applied to the external terminal $A_0$, a node N63 receives a potential lower than the potential received at the external terminal $A_0$ by the sum of the threshold voltages of diode-connected N-channel MOSFET's Q-1 to Q-m, or $m \times$ Vth (where Vth represents the threshold voltage of each MOSFET and m represents the number of those MOSFET's). That is, the potential applied to the external terminal $A_0$ is reduced by the threshold voltage Vth of each of the m MOSFET's Q-1 to Q-m before transmitted to the node N63. The threshold voltage Vth and the number m of these MOSFET's are selected such that only when the external terminal $A_0$ receives a higher-potential signal than usual, or only in the test mode, the potential at the node N63 attains the high level. The potential of the node N63 is first inverted by an inverter INV1 comprising a P-channel MOSFET Q11 and an N-channel MOSFET Q13 which are connected in series between supply potential Vcc and ground potential GND, further inverted by an inverter INV2 comprising a P-channel MOSFET Q12 and an N-channel MOSFET Q14 which are connected in series between the supply potential Vcc and the ground potential GND, and then outputted as the signal A0'. Therefore, only when a signal of higher potential than usual is applied to the external terminal $A_0$, the potential of the node N63 attains the high level and thus the signal A0' also attains the high level. Further, output of the inverter INV1 is also applied to the gate of a P-channel MOSFET Q10. Therefore, when the output of the inverter INV1 falls to the low level due to the high level attained at the node N63, the MOSFET Q10 is rendered conductive so that the supply potential Vcc is transmitted to the node N63. As a result, the potential of the node N63 is fixed at the high level. Following this, also the potential of the output signal A0' is fixed at the high level. Accordingly, once the signal of higher potential than usual, which indicates test mode, is applied to the external terminal A0, this high voltage detecting circuit continues to output the high level signal.

FIG. 9 is a time chart showing relationship between the signal applied to the external terminal $A_0$ and the output signal A0' of a high voltage detecting circuit as described above, with respect to their potential. Referring to FIG. 9A, in a practical test, the potential of the signal applied to the external terminal A0' is set, during a time period $T_1$, to a level higher than usual to serve as a test signal, and returned to the normal level. Then, the external terminal $A_0$ begins to receive address signals and the test is conducted during the time period $T_2$. Meanwhile, the signal A0' attains the high level in response to the signal received at the external terminal $A_0$ having attained the higher level, and thereafter, holds on the same level, as shown in FIG. 9B. Since the high level signal is outputted from the high voltage detecting circuit even during the time period $T_2$ in this manner, the test signal generating circuit in FIG. 6 continues to output, during the test period $T_2$, a test signal for switching output of the power circuit for test mode/normal mode to a potential lower than the supply potential Vcc for test mode. That is, during the test period $T_1$, the test signal generating circuit 83 and the power circuit 94 for test mode/normal mode in FIG. 6 are set in the test state. During the test period $T_2$, in response to the address signals applied to the external terminal $A_0$, the SRAM operates as usual for selecting a memory cell. Thus, it has become possible to conduct the disturb test while the potential lower than the supply potential Vcc is supplied to the memory cells during the time period $T_2$. Meanwhile, the high voltage detecting circuit 85 in FIG. 6 may be configured in the same manner as the high voltage detecting circuit 84 above.

In the present embodiment, an SRAM which has once entered in the test mode gets out of that state when the power is turned off. In the following method, however, the SRAM can be relieved from the test mode without turning off the power. That is, an additional high voltage detecting circuit is provided to the SRAM. In response to the H-level output of this high voltage detecting circuit, outputs of the high voltage detecting circuits 84 and 85 in the test signal generating circuit 83 are reset to the L-level. More specifically, the output of the additional high voltage detecting circuit is applied as a reset signal to portions constituting latch circuits (inverters INV1 and INV2 and transistor Q10 in FIG. 8) in the high voltage detecting circuits 84 and 85. Therefore, by externally applying a high voltage to the additional high voltage detecting circuit, the SRAM can be switched from the test mode to the normal mode at a desired timing.

In the embodiments shown in FIGS. 4 and 6, conditions (voltage level and timing of rise) of the signal applied to the external terminal for receiving address signals or write signals are set outside the normal range, and a circuit for detecting such abnormal conditions is provided on the chip to develop an output, based on which a test signal is generated. However, such an external terminal for producing the test signal is not limited to those, but any other one may be selected therefor.

While in the embodiment shown in FIG. 6, a plurality of test signals are generated inside the SRAM, additional external terminals may, of course, be provided for receiving externally applied such test signals. When there are limitations on the number of external terminals that can be provided, however, the former embodiment will be advantageous where an existing external terminal is used to generate the test signals inside the SRAM.

Meanwhile, the corresponding relationship between the mode (test mode/normal mode) of an SRAM and the level of the test signals may be contrary to that in all the embodiments above. That is, the test signals may be set to the H-level in the test mode. In this case, however, the P-channel MOS transistors are replaced by N-channel MOS transistor: as switches which suspend/effect supply of drive voltages for testing to the memory cells in all the embodiments above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static type semiconductor memory device, comprising:
   a plurality of memory cells arranged in a matrix of rows and columns, each memory cell including a flip-flop;
   designating means for outputting a first signal representing a normal operating mode of said semiconductor memory device and outputting a second representing a test operating mode of said semiconductor memory device; and
   first and second drive voltage generating means connected to said plurality of memory cells for generating first and second drive voltages to drive said plurality of memory cells, said first drive voltage generating means responsive to said first signal and said second drive voltage generating means responsive to said second signal wherein said first drive voltage generating means is deactivated when said second drive voltage generating means is generating said second drive voltage.

2. The static type semiconductor memory device according to claim 1, wherein
   said second drive voltage is lower than said first drive voltage.

3. A static type semiconductor memory device, comprising:
   a plurality of memory cells arranged in a matrix of rows and columns, each memory cell including a flip-flop;
   designating means for outputting a first signal representing a normal operating mode of said semiconductor memory device and outputting a second signal representing a test operating mode of said semiconductor memory device; and
   drive voltage generating means connected to said plurality of memory cells and responsive to said first and second output signals for generating first and second drive voltages to drive said plurality of memory cells, said drive voltage generating means comprising
   a first drive voltage generating means provided between a voltage source which supplies a relatively high voltage and said plurality of memory cells, said first drive voltage generating means being responsive to the first signal from said designating means to generate said first drive voltage and apply the same to said plurality of memory cells; and
   a second drive voltage generating means provided between said voltage source and said plurality of memory cells, said second drive voltage generating means being responsive to the second signal from said designating means to generate said second drive voltage and apply the same to said plurality of memory cells;
   wherein said second drive voltage has a lower value than said first drive voltage; and
   said designating means designate the normal operating mode and only one test operating mode.

4. The static type semiconductor memory device according to claim 3, wherein
   said first drive voltage generating means comprises a first P-channel field effect semiconductor device having a first conduction terminal connected to said voltage source, a second conduction terminal connected to said plurality of memory cells, and a control terminal receiving the first signal from said designating means.

5. The static type semiconductor memory device according to claim 3, wherein
   said second drive voltage generating means comprises:
   an N-channel field effect semiconductor device having a first conduction terminal connected to said voltage source, a control terminal receiving a predetermined voltage, and a second conduction terminal; and
   a second P-type field effect semiconductor device having a first conduction terminal connected to said second conduction terminal of said N-channel field effect semiconductor device, a second conduction terminal connected to said plurality of memory cells, and a control terminal receiving the second signal from said designating means.

6. The static type semiconductor memory device according to claim 3, wherein
   the first signal and the second signal applied to the control terminals of said first and second P-channel field effect semiconductor devices, respectively, are complementary to each other in their logic level.

7. The static type semiconductor memory device according to claim 3, wherein
   said predetermined voltage is equal to the supply voltage of said voltage source.

8. The static type semiconductor memory device according to claim 3, wherein
   said predetermined voltage is of any level lower than the supply voltage of said voltage source.

9. An operating method of a static type semiconductor memory device which comprises a plurality of memory cells arranged in a matrix of rows and columns, each memory cell including a flip-flop, comprising the steps of:
   selectively designating a normal mode and a test mode;
   supplying a first drive voltage to said plurality of memory cells in response to said normal mode having been selectively designated;
   interrupting said first drive voltage; and
   supplying a second drive voltage lower than said first drive voltage to said plurality of memory cells in response to said test mode having been selectively designated.

10. A static type semiconductor memory device, comprising:
    a plurality of memory cells arranged in a matrix of rows and columns, each memory cell including a flip-flop;
    designating means for outputting a first signal representing a normal operating mode of said semiconductor memory device and outputting a second signal representing a test operating mode of said semiconductor memory device; and drive voltage generating means connected to said plurality of memory cells and responsive to said first and second output signals for generating first and second drive voltages to drive said plurality of memory cells;

wherein said second drive voltage has a lower value than said first drive voltage, said designating means designates the normal mode and a plurality of test modes, said second drive voltage generated from said drive voltage generating means includes a plurality of drive voltages each corresponding to one of said plurality of test modes, and said drive voltage generating means is responsive to an output from said designating means designating the normal mode to generate said first drive voltage and apply the same to said plurality of memory cells, and responsive to outputs from said designating means designating said plurality of test modes to generate a corresponding drive voltage and apply the same to said plurality of memory cells.

* * * * *